US006507195B1

United States Patent
Nonaka

(10) Patent No.: US 6,507,195 B1
(45) Date of Patent: Jan. 14, 2003

(54) ELECTRONIC APPARATUS USING REMOVABLE BATTERIES AS DRIVE SOURCE

(75) Inventor: Osamu Nonaka, Sagamihara (JP)

(73) Assignee: Olympus Optical Co., Ltd. (JP)

( * ) Notice: Subject to any disclaimer, the term of this patent is extended or adjusted under 35 U.S.C. 154(b) by 33 days.

(21) Appl. No.: 09/590,514

(22) Filed: Jun. 9, 2000

(30) Foreign Application Priority Data

Jun. 16, 1999 (JP) .......................................... 11-170036

(51) Int. Cl.$^7$ ............................................. G01N 27/416
(52) U.S. Cl. ......................................................... 324/430
(58) Field of Search ............................... 324/426, 427, 324/430, 434; 320/132, 148

(56) References Cited

U.S. PATENT DOCUMENTS 5,701,527 A * 12/1997 Sakabe et al. ............... 396/277
6,087,808 A *  7/2000 Pritchard ..................... 320/132
6,137,263 A * 10/2000 Kawai et al. ................ 320/132
6,242,920 B1 *  6/2001 Nelson et al. ............... 324/427
6,313,637 B1 * 11/2001 Iino et al. .................... 324/434

FOREIGN PATENT DOCUMENTS

JP      7-064146      3/1995
JP      7-234433      9/1995

* cited by examiner

Primary Examiner—Diego Gutierrez
Assistant Examiner—Etienne P. LeRoux
(74) Attorney, Agent, or Firm—Straub & Pokotylo; John C. Pokotylo

(57) ABSTRACT

The present invention is electronic apparatus using removable batteries as a drive source, the apparatus comprising a control section for detecting an internal resistance value of the batteries and using this value to determine how the batteries are consumed, a memory that stores a result of the determination made by the determination circuit, a display section for showing how the batteries are consumed, and a control circuit for controlling the display section. In particular, the control circuit determines display contents depending on information stored in the memory.

21 Claims, 10 Drawing Sheets

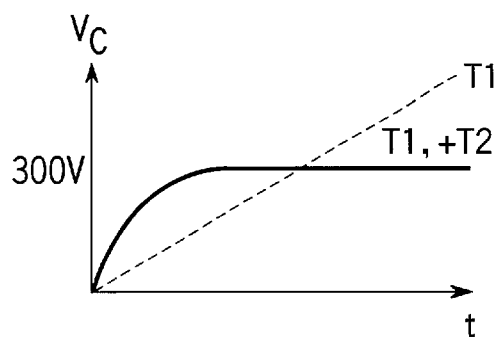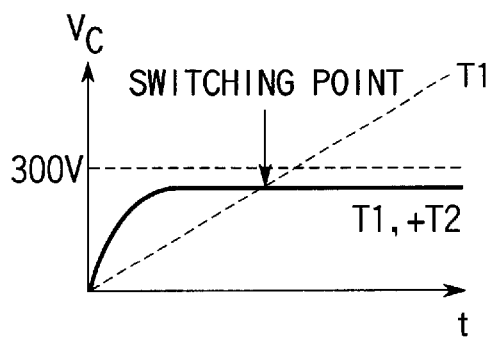
FIG. 9A  FIG. 9B
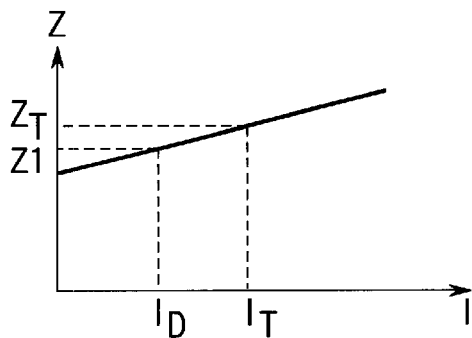
FIG. 11
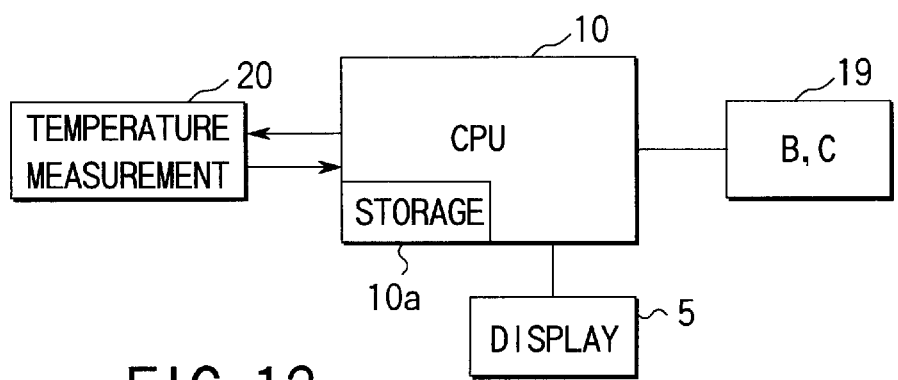
FIG. 12

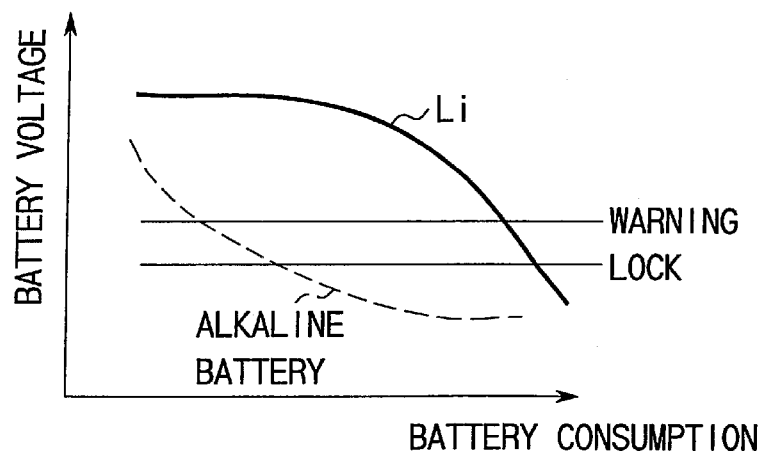
FIG. 14 (Prior Art)
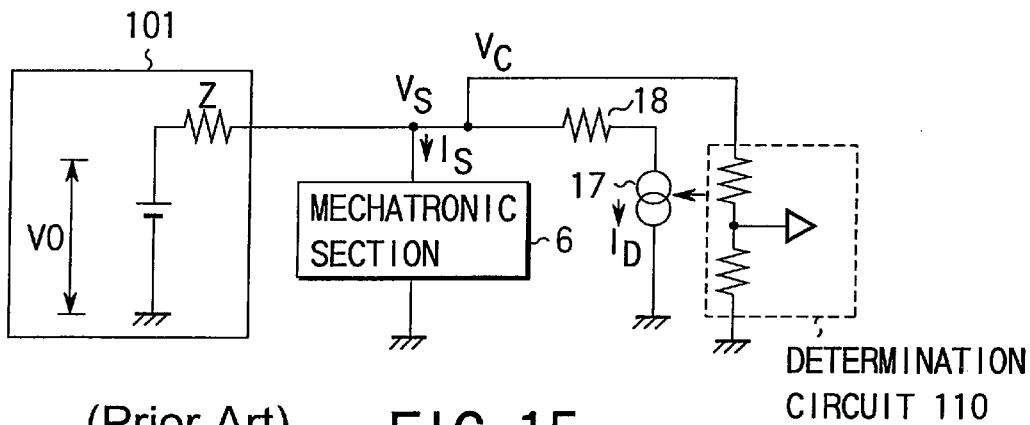
(Prior Art) FIG. 15
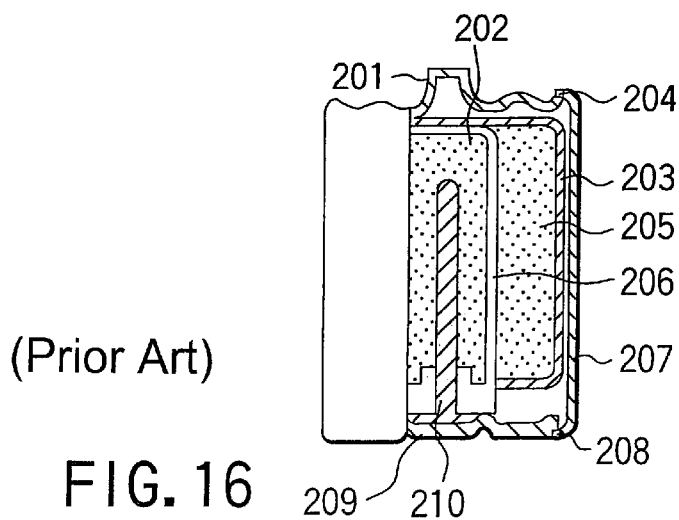
(Prior Art) FIG. 16

ELECTRONIC APPARATUS USING REMOVABLE BATTERIES AS DRIVE SOURCE

CROSS-REFERENCE TO RELATED APPLICATIONS

This application is based upon and claims the benefit of priority from the prior Japanese Patent Application No. 11-170036, filed Jun. 16, 1999, the entire contents of which are incorporated herein by reference.

BACKGROUND OF THE INVENTION

The present invention relates to electronic apparatus using batteries as a drive source, and in particular, to battery-driven apparatus having a battery exhaustion determining function for apparatus such as cameras.

Today, various dry batteries are commercially available. Image pickup devices, for example, cameras generally use as a power supply, lithium (Li) batteries, which have a large capacity and whose internal resistance or open voltage does not vary rapidly despite exhaustion.

For example, electronic apparatus such as remote control devices for televisions and radios or radio cassettes commonly use size D to A alkaline or manganese batteries, but these batteries are more inexpensive and popular than the lithium batteries. These alkaline or manganese batteries are sold at many stores such as convenience stores and station kiosks.

Thus, camera users prefer cameras that allow the use of size B or A batteries for replacements, which are readily available and inexpensive. Since, however, these size D to A batteries can be manufactured easily, they are manufactured in many countries and by various manufacturers and have different characteristics.

Such characteristics include the number of frames that can be photographed by a camera before batteries are exhausted and must be replaced with new ones. Even if a camera uses batteries from a battery manufacturer observing a predetermined standard, if the camera user replaces these batteries with ones from a different manufacture having different characteristics, the number of frames that can be photographed during the lifetime of the batteries changes. As a result, performance achieved by the camera depends heavily on the operating batteries.

Compared to the lithium batteries, the alkaline batteries have small variations in voltage even when exhausted, as shown in FIG. 14. Accordingly, level setting is difficult in determining whether or not the batteries have been consumed to the extent that the camera cannot be operated. Without the display of a warning indicating that, for example, an incorrect level setting causes the camera to malfunction, the user does not know when to replace the batteries, thereby missing perfect moments for good photographs.

In addition, different alkaline battery manufactures use significantly different internal resistances or temperature conditions. Accordingly, without the accurate knowledge of such differences, it is impossible to check beforehand whether or not the camera operates correctly.

In contrast, since a camera with lithium batteries does not have the internal resistance of the batteries varying rapidly, the batteries are effectively checked using a circuit configured, for example, as shown in FIG. 15.

In FIG. 15, reference numeral 101 denotes an equivalent circuit for batteries which takes their internal resistance into consideration. Reference numeral 6 denotes a site of the camera which is driven by the batteries, for example, a shutter or a winding movable mechatornic section actuated by an actuator such as a plunger or a motor. A predetermined current Is or higher must be conducted through these actuators before they can be operated.

When the amount of required current is defined as Is, a voltage Vs is applied to the mechatronic section 6 as shown in:

$$Vs = V0 - ZIs \quad (1)$$

If, for example, a mechanism such as a shutter is checked for opening and closing operations before photographing, unwanted image pick-up or film exposure may result. Thus, an alternative means must be used to maintain correct operations based on the battery voltage. Thus, the correct operations are conventionally maintained by turning on a current source 17 to provide a checking dummy current ID and determining the resulting battery voltage Vc.

In this case, the following equation holds:

$$Vc = V0 - ZID \quad (2),$$

so that with the above Equation (1), the following equation holds:

$$Vc = Vs + ZIs - ZID = Vs + Z(Is - ID) \quad (3)$$

Further, since the Is, ID, and Z are known, a required voltage Vs can be determined from Vc using the following Equation (4):

$$Vs = Vc - Z \cdot (Is - ID) \quad (4)$$

That is, with conventional cameras, by monitoring the battery voltage Vc effected when the dummy current ID is conducted, whether or not the battery voltage is sufficient to actuate the mechatronic section 6 can be determined. That is, the battery check can be performed. The determination based on Equation (4), however, is ineffective on batteries with a varying Z.

To solve such a problem, conventional documents, for example, Jap. Pat. Appln. KOKAI Publication No. 7-64146 and U.S. Pat. No. 5,701,527 disclose techniques for improving battery check timings or loads attended with battery checks or the like to maximize the performance of the batteries.

However, the techniques disclosed by Jap. Pat. Appln. KOKAI Publication No. 7-64146 and U.S. Pat. No. 5,701,527 are only applications of the above Equation (4) and fail to take into account a voltage recovery effect of the batteries, which is a particular characteristic of the alkaline batteries.

Due to this voltage recovery effect, when batteries that have been determined to be exhausted are left for a certain period of time, they may instantaneously exhibit characteristics similar to those of new batteries because chemical reaction within the batteries changes during this period in a manner such that their voltage appears to be recovered.

The alkaline battery will be described below with reference to FIG. 16 showing a sectional view thereof.

As shown in this figure, an armor 207 houses a vessel 203 that seals a positive-electrode mix 205 and a gelated negative-electrode zinc 202 that are separated by a separator 206 comprising a non-woven cloth so that manganese dioxide and an electrolyte contained in the positive-electrode mix 205 react to zinc in the negative electrode to generate an electromotive force. Reference numeral 201 denotes a terminal plate. Reference numerals 204, 208 denote an insulating ring. Reference numeral 209 denotes a bottom plate. Reference numeral 210 denotes a negative-electrode collector.

After this reaction, a reactant remains in the electrolyte to increase the internal resistance of the batteries. Consequently, a discharge characteristic of the alkaline battery is as shown in FIGS. 3A and 3B; that is, the internal resistance increases as the discharge progresses. Once the discharge stops, however, the progressing chemical reaction is partly cleared to exhibit a "recovery characteristic (the voltage recovery effect)". If these batteries are checked for exhaustion, the result will be incorrect. That is, the batteries are shown to be new though they must actually be replaced with new ones.

Such a mistaken determination causes the user to miss the chance of replacing the batteries, so that a warning may appear or photographing may be disabled immediately after the start of actual photographing, thereby making the user panic. In particular, an irreparable situation may occur if such a mistaken determination is made before occasions such as travel and a wedding ceremony when many photographs are taken.

BRIEF SUMMARY OF THE INVENTION

The present invention is provided in view of the above problems, and it is an object thereof to check batteries taking their recovery characteristic (the voltage recovery effect) into consideration to urge a user to replace the batteries with new ones at an appropriate time in order to avoid the worst situation where the user miss perfect moments for good photographs.

To attain this object, a first aspect of the present invention provides electronic apparatus using removable batteries as a drive source, the apparatus comprising a display section for showing how the batteries are consumed, a determination circuit for detecting internal resistance value of the batteries and using this value to determine how the batteries are consumed, a memory that stores a result of the determination made by the determination circuit, and a control circuit for controlling the contents of the display on the display section depending on the current determination result information from the determination circuit and on the past determination result information stored in the memory.

A second aspect of the present invention provides electronic apparatus using removable batteries as a drive source, the apparatus comprising a display section for showing how the batteries are consumed, a first memory that stores a current value and a voltage value required for camera operations, a determination circuit for detecting a internal resistance value of the batteries and using this value and the current and voltage values stored in the first memory to determine how the batteries are consumed, and a control circuit for controlling the contents of the display on the display section depending on a result of the determination made by the determination circuit.

A third aspect of the present invention provides electronic apparatus using removable batteries as a drive source, the apparatus comprising decision means for deciding a timing used to determine a battery state, determination means for using the determination timing decided by the decision means, to determine the battery voltage, temperature measuring means for measuring a temperature of the batteries or a periphery thereof, storage means for storing a result of the determination made by the determination means and a temperature measurement result from the temperature measuring means, display means for showing how the batteries are consumed, and display control means for deciding the contents of the display on the display means to control the display means based on the information stored in the storage means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9A is a chart showing a difference in time required to complete charging between charging a primary coil of a transformer using only T1 and charging it using T1+T2, which has a larger number of turns and a smaller turn ratio, wherein a battery voltage is sufficient, and FIG. 9B is a chart showing a difference in time required to complete charging between charging the primary coil of the transformer using only the T1 and charging it using the T1+T2, which has the larger number of turns and the smaller turn ratio, wherein the battery voltage has decreased;

FIG. 11 is a chart showing dependence of internal resistance of batteries on current;

FIG. 12 is a conceptual diagram showing the battery-driven apparatus according to the third embodiment;

FIG. 14 is a chart showing consumption of common alkaline and lithium batteries vs. decrease in voltage thereof;

FIG. 15 is a diagram showing the configuration of a battery check circuit according to the prior art; and FIG. 16 is a diagram showing a common alkaline battery in cross section.

DETAILED DESCRIPTION OF THE INVENTION

The present invention will be described below with reference to the drawings showing embodiments thereof.

First, a first embodiment of the present invention will be explained in detail.

The first embodiment provides battery-driven apparatus using removable batteries as a drive source, the apparatus examines internal resistance of batteries and current consumption of a mechatronic system to issue a predetermined warning for exhausted batteries that do not meet a predetermined performance, in order to urge a user to replace the batteries with new ones at a predetermined time, thereby maximizing characteristics of the batteries while preventing the user from missing the time for battery replacement.

Figure 1A:
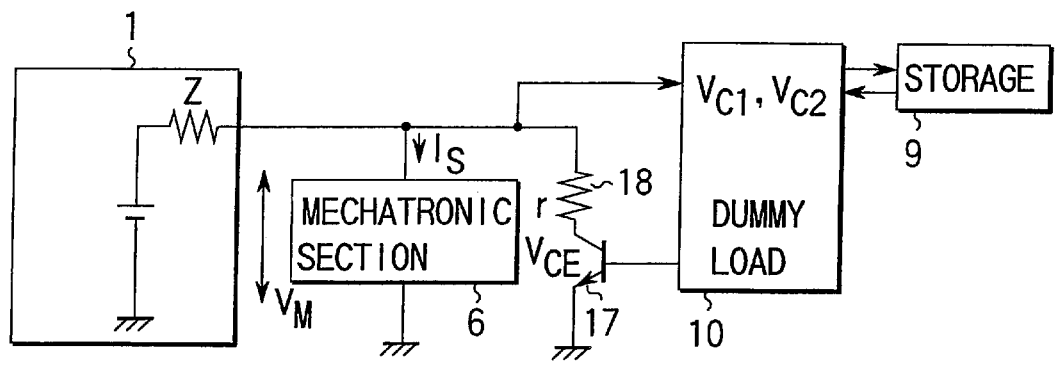
FIG. 1A is a simplified diagram of a battery-driven apparatus according to a first aspect of the present invention.

The basic concept of battery checks using the battery-driven apparatus according to the first embodiment will be described with reference to FIG. 1A.

As shown in this figure, the battery-driven apparatus comprises a determination circuit 10 for checking batteries based on predictive battery-voltage-drop determinations, a dummy resistor 18, a switching transistor 17, a mechatronic section 6, and batteries 1 having internal resistance Z. The determination circuit 10 turns on and off the switching transistor 17 in accordance with predetermined timings to control electric conduction through the dummy resistor 18, and detects a voltage Vc1 during an open state of the batteries 1 and a voltage Vc2 during a loaded state thereof.

If a resistance value of the dummy resistor 18 is defined as r and a voltage between an emitter and a collector of the switching transistor 17 is defined as VCE, then the detected battery voltages Vc1, Vc2 are shown by:

$$Vc1=((V0-VCE)/(Z+r))\times r+VCE \quad (5)$$

$$Vc2=V0 \quad (6)$$

Based on the relationship shown in Equations (5) and (6), the internal resistance Z of the batteries 1 is shown by:

$$Z=((Vc1-Vc2)/(Vc2-VCE))\times r \quad (7)$$

Accordingly, if the determination circuit 10 carries out a calculation in accordance with Equation (8), shown below, a voltage VM at the mechatronic section 6 is determined by:

$$VM=Vc1-((Vc1-Vc2)/(Vc2-VCE))\times r\times IM \quad (8)$$

The current value IM is predetermined. Consequently, by determining a minimum required voltage VM0 and obtaining a result of Equation (8), the determination circuit 10 can determine the correct voltage at the mechatronic section 6 taking the internal resistance Z into account and regardless of variations in temperature and differences in battery quality among manufactures.

Although the mechatronic system has been described by way of example, the present invention is effective for those sites that deal with a large current on the order of amperes. Of course, the present invention is also applicable to stroboscope charging systems for cameras and auto focus (AF) systems using a large current to allow infrared emitting diodes to emit light.

That is, due to the internal resistance Z of the batteries 1, a large current reduces the battery voltage. Consequently, this battery check based on the predictive battery-voltage-drop determination is very effective on circuits that are affected by the decrease in battery voltage.

Even among alkaline batteries, there are differences in discharge from the batteries 1 and in variation of the internal resistance Z depending on temperature or the manufacturer. Thus, the batteries must be checked taking these differences into consideration.

Figure 2:
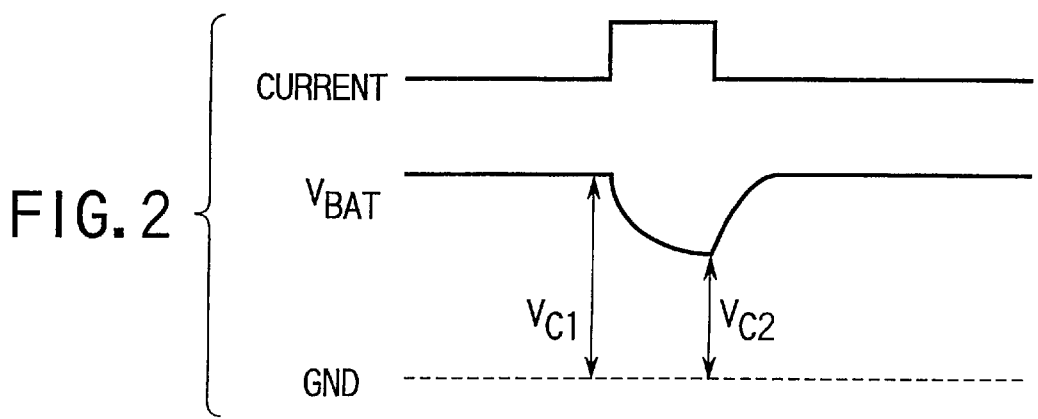
FIG. 2 is a chart showing a battery voltage Vc1 obtained when a predetermined current is provided by batteries for a fixed amount of time vs. a battery voltage Vc2 obtained when this discharge is stopped.

FIG. 2 shows a battery voltage Vc1 obtained when a predetermined current is provided by the batteries 1 for a fixed amount of time vs. a battery voltage Vc2 obtained when this discharge is stopped.

Figure 3A:
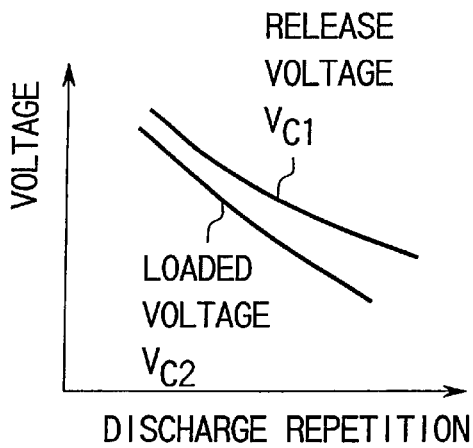
FIG. 3A is a chart showing how battery consumption varies voltage characteristics if an operation of conducting a current through a battery and then stopping the conduction is repeated.
Figure 3B:
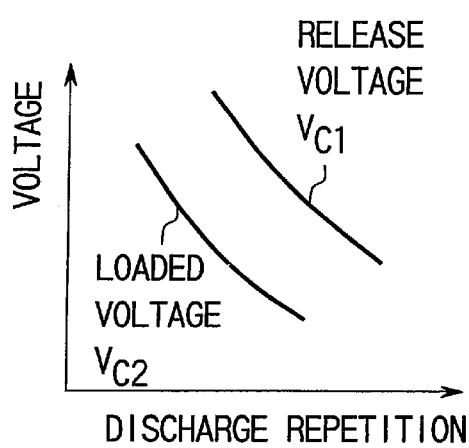
FIG. 3B is a chart showing how the battery consumption varies the voltage characteristics if an operation of conducting a current through another battery and then stopping the conduction is repeated.

When an operation of conducting and stopping this current is repeated many times, the batteries 1 are consumed to cause voltage characteristics to vary as shown in FIGS. 3A and 3B.

Furthermore, this variation varies significantly among batteries (such a variation is shown in FIGS. 3A and 3B). The battery-driven apparatus according to the present invention checks the batteries for exhaustion taking this point into account.

Figure 4:
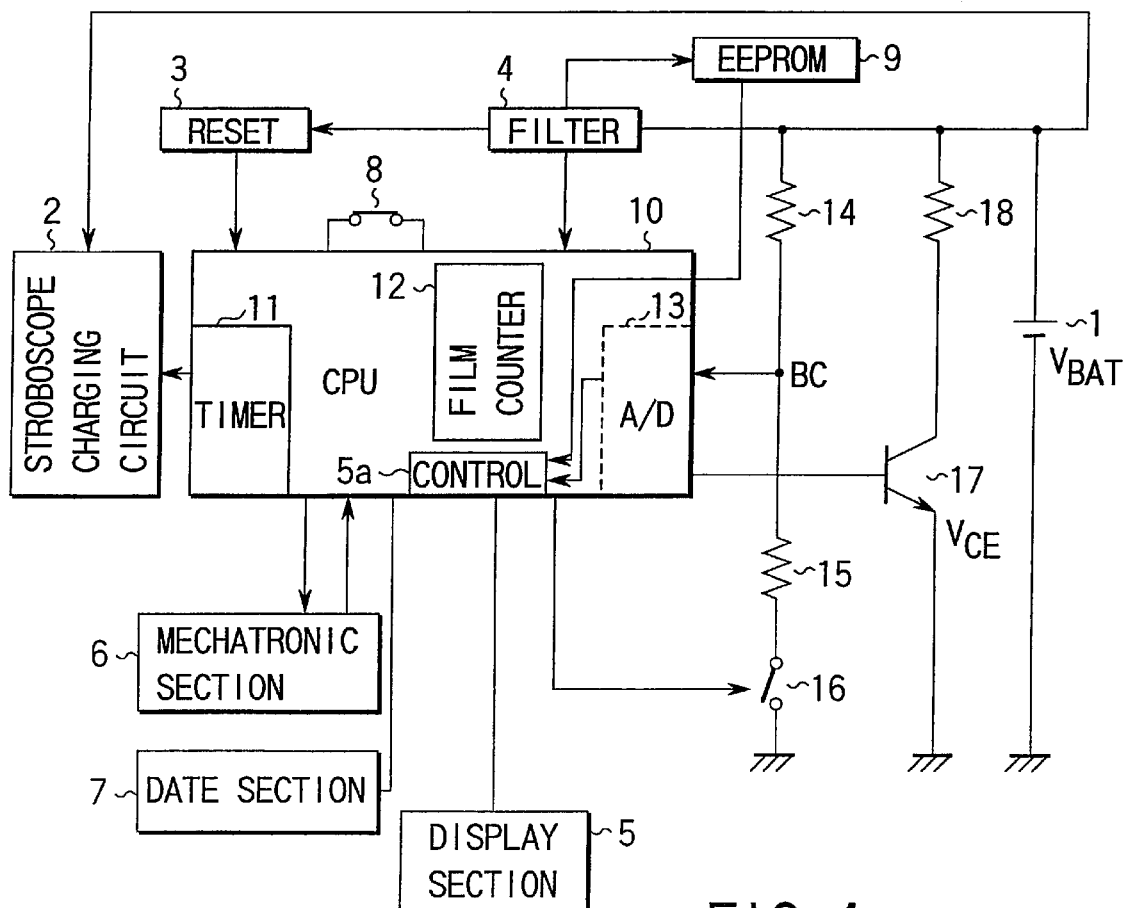
FIG. 4 is a block diagram showing the configuration of battery-driven apparatus according to the first embodiment.

FIG. 4 is a block diagram showing the configuration of the battery-driven apparatus according to the first embodiment.

In this figure, reference numeral 10 denotes an arithmetic control circuit (hereafter referred to as a "CPU") comprising a one-chip microcomputer or the like and which detects instructions provided by a photographer by operating a switch 8, to execute sequences for the entire device. The CPU 10 comprises a timer 11 having a clocking function, a film counter 12 for counting the number of photographed frames, an A/D converter 13 for converting input analog signals into digital ones, and the like.

In this FIG. 4, the CPU 10 may internally have a date section 7 externally connected thereto and having a date updating function. Further, a display section 5 for displaying the date or the like commonly comprises a liquid crystal, but of course results of battery checks may be displayed on this liquid crystal.

The present invention is characterized in that in controlling the display section, a control section 5a references the contents of an EEPROM 9 acting as a storage means. This is to reflect the last check result to improve reliability based on the concept that a single battery check is insufficient for accurate determinations.

Figure 5A:
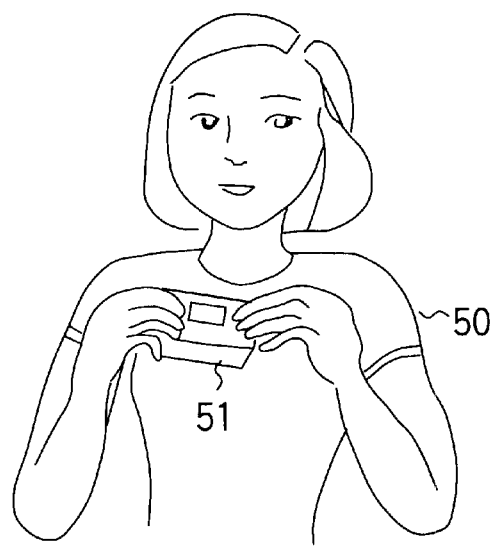
FIG. 5A is a view showing how a user operates a camera.
Figure 5B:
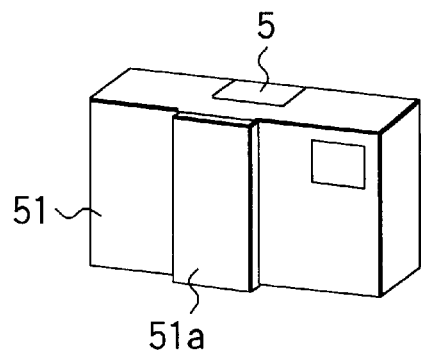
FIG. 5B is a view showing that a barrier of the camera is closed.
Figure 5C:
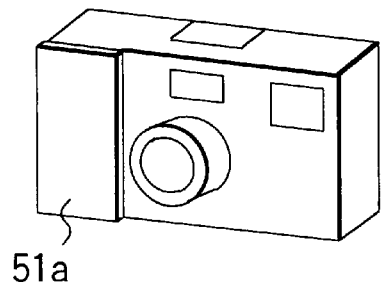
FIG. 5C is a view showing that the barrier of the camera is open.

Since the above described configuration allows a user 50 to operate the switch 8 to check consumption of the batteries on the liquid crystal screen of the display section 5 as appropriate before operation, the user can replace the batteries as required before photographing, thereby avoiding failures in photographing as shown in FIGS. 5A to 5C. For example, for a camera with a barrier covering a lens section in a front surface thereof, the switch 8 is actuated in response to opening of a barrier 51a so that an LCD 5 provided on a top surface or the like of the camera 51 can show how the batteries are consumed when the barrier 51a is opened.

Figure 6A:
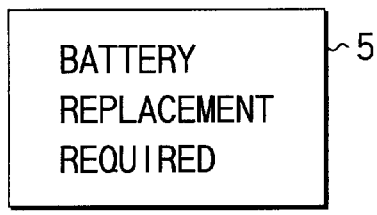
FIG. 6A is a diagram showing a display section 5 displayed "BATTERY REPLACEMENT REQUIRED"
Figure 6B:
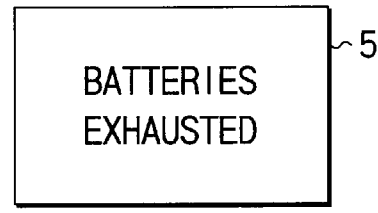
FIG. 6B is a diagram showing a display section 5 displayed "BATTERY EXHAUSTED"
Figure 6C:
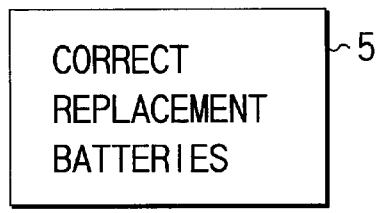
FIG. 6C is a diagram showing a display section 5 displayed "CORRECT REPLACEMENT BATTERIES"

In this case, displays such as those shown in FIGS. 6A to 6C are provided on the liquid crystal screen acting as the display section 5. That is, FIG. 6A shows that the batteries must be replaced with new ones and FIG. 6B shows that the batteries are exhausted. The display in FIG. 6C will be referred to later.

As shown above in FIG. 2, the internal resistance of the batteries 1 causes a decrease in battery voltage VBAT during current conduction. The internal resistance increases linearly with energy consumption of the batteries 1.

FIG. 2 shows the voltage Vc1 during the open state and the voltage Vc2 obtained while a current is provided, that is, the voltage during the loaded state. The internal resistance Z can be determined as described above by dividing the difference between these voltages by the current value.

According to this first embodiment, the dummy resistor 18 derives a predetermined amount of current from the batteries, and the transistor 17 is turned on for this derivation. In addition, the A/D converter 13 can detect no voltage higher than a power supply voltage, so that the resistors 14, 15 share the VBAT for DC conversion.

In the configuration with no resistors other than the resistors 14, 15 disposed therein, a current is continuously conducted. Accordingly, a separate switch 16 is provided so that the batteries are checked only when the switch 16 is actuated.

The above Equation (8) is used for this battery check.

The CPU 10 executes this calculation in accordance with a program stored in a ROM (not shown) beforehand. In this execution, the r×IM in the above Equation (8) and the minimum required voltage VM0 tend to vary among cameras.

Accordingly, the first embodiment obtains the above information beforehand and stores the specific values of the camera in the EEPROM 9, which is a non-volatile memory, so that the batteries can be accurately checked taking the above described variations into consideration.

Additionally, the voltage VCE, which does not vary significantly as described above, is stored in the ROM (not shown) in the CPU 10 in advance.

In addition, while energy from the batteries is used to actuate the stroboscope charging circuit 2, operation of the stroboscope charging circuit 2 substantially varies the battery voltage.

To prevent the CPU 10 from malfunctioning due to such variations, a separate filter circuit 4 is provided to stabilize the power supply.

Likewise, in a camera that drives a zoom lens or requires a shutter or a film, noise may occur in power supply voltage characteristics when the mechatronic section 6, which winds the above components, is actuated via an actuator. The filter circuit 4 deals with this problem to contribute to stabilization of the power supply for the CPU 10.

Since, however, the filter circuit 4 cannot be set to be perfect, if a large current flows out from the batteries, the battery voltage decreases sharply below a minimum operating voltage for the CPU 10. While the CPU 10 is operating incorrectly, correct camera operations are not expected. Accordingly, the current conduction is stopped to prevent malfunction.

Since the first embodiment enables how the voltage is to decrease to be determined in advance, when the CPU 10 has calculated a predetermined amount or more of expected voltage drop, the operational sequence described below is prohibited.

Figure 7:
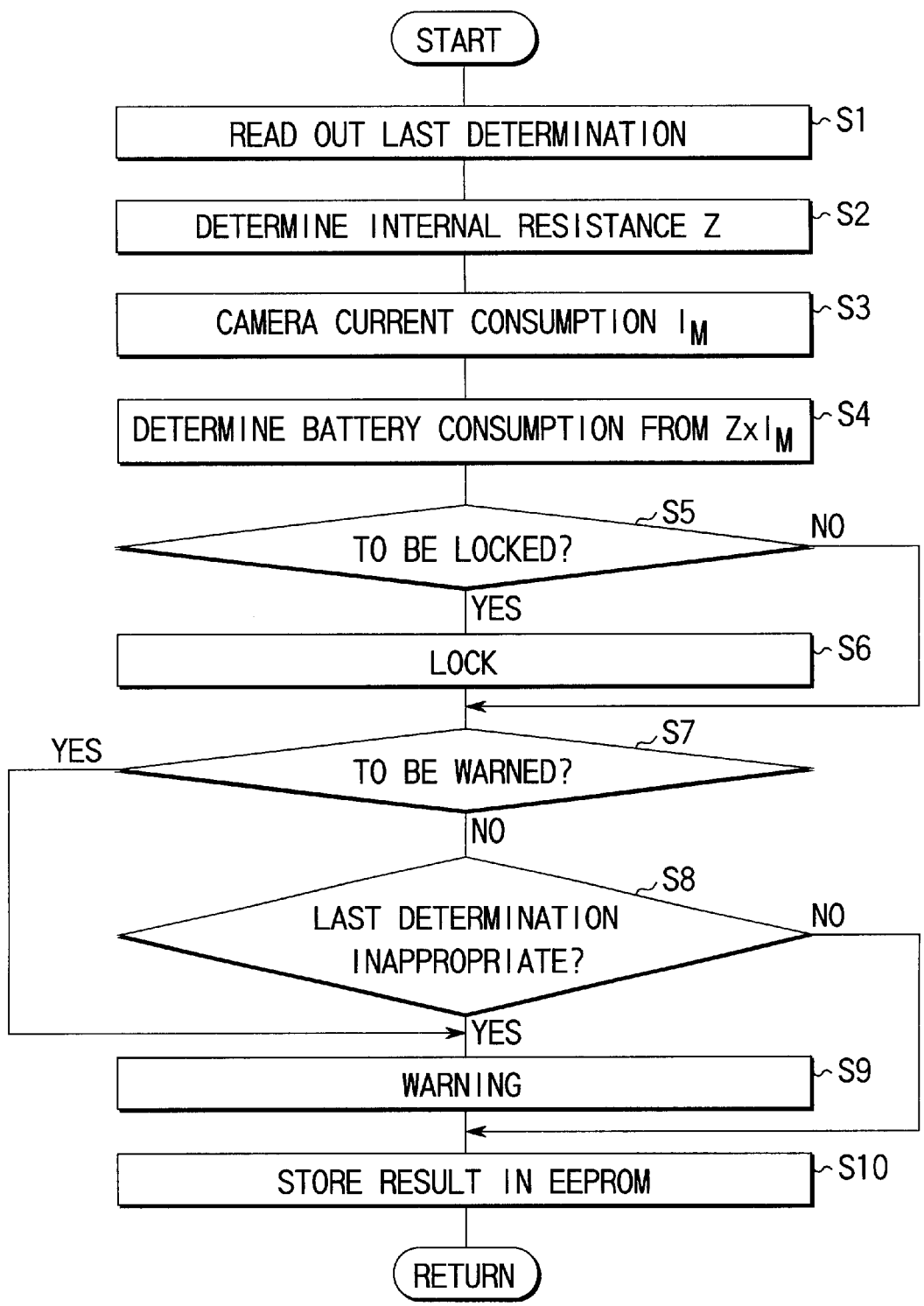
FIG. 7 is a flow chart useful in simply explaining the operation of the battery-driven apparatus according to the first embodiment.

The operation of the battery-driven apparatus according to the first embodiment will be described below in brief with reference to the flow chart in FIG. 7.

This battery-driven apparatus determines the internal resistance value Z of the batteries 1 and the current consumption of the mechatronic section to issue, for consumed batteries that do not achieve a predetermined performance, a warning indicating battery exhaustion, while simultaneously prohibiting camera operations. In the following description, it is assumed that the batteries have been checked at least once and that a result of the battery check has been stored in the EPROM 9. When the camera is first operated after purchase, the battery consumption is expected to be small, so that no previous battery check results are taken into consideration.

When the user 51 opens the barrier 51a, the switch 8 is actuated to start this sequence.

At a step S1, the last battery check result is read out from the EEPROM 9. At a step S2, the transistor 17 is turned on and off in accordance with predetermined timings to detect the battery voltage Vc1 during the open state and the battery voltage Vc2 during the loaded state, and a calculation is executed pursuant to the above described Equation (7) to obtain the internal resistance Z of the batteries 1.

At a step S3, the current IM flowing through the mechatronic section 6, that is, the current consumption of the camera is read out and obtained from the EEPROM 9. As described above, the current value IM tends. to vary among cameras, so that a specific value of the camera is predetermined and stored in the EEPROM 9 during manufacture.

At a step S4, the internal resistance value Z calculated at the step S2 and the value IM of the current flowing through the mechatronic section and which has been obtained at the step S3 are used to calculate the voltage VM at the mechatronic section 6 in accordance with Equation (8), thereby determining how the batteries are consumed. Specifically, the calculated voltage VM is compared with the minimum required voltage VM0 of the camera to determine that the batteries 1 are not exhausted if VM>VM0, while determining that the batteries 1 are exhausted if VM<VM0.

The steps S2 to S4 constitute a specific processing section for the present battery check.

At a step S5, if it is determined at the step S4 that the batteries 1 are exhausted, the process proceeds to the next step S6. At the step S6, the camera operations are prohibited, and at the next step S7, it is determined that a warning should be issued to the user 51. At a step S9, a display showing how the batteries 1 are consumed or a warning display is displayed on the display section 5 to warn the user 51.

On the other hand, at the step S5, if it is determined at the step S4 that the batteries 1 are not exhausted, the process proceeds to the step S7. At the step S7, since it has been determined at the step S4 that the batteries 1 are not exhausted, it is then determined that the warning is not required and the process advances to the next step S8.

At the step S8, the last battery check result, which has been read out from the EEPROM 9 at the step S1, is referenced, and if this result is negative, the process advances to the next step S9 to provide the above described warning.

At a step S10, the current determination result is stored in the EEPROM 9 for the next battery check, and this routine is returned.

The present invention is characterized in that the last check result is reflected in the step S8 after the warning determination (the step S7).

That is, if the current battery check result is affirmative for the batteries for which the warning was issued during the last battery check, it is determined that the batteries only appear to be temporarily recovered and the warning is issued again (the step S9). The above result is stored in the EEPROM 9 (the step As described above, the first embodiment can provide battery-driven apparatus applicable to cameras or the like, the apparatus maximizing the characteristics of the batteries while preventing the user from missing an appropriate time for battery replacement.

Next, a second embodiment of the invention will be explained in detail.

Figure 8:
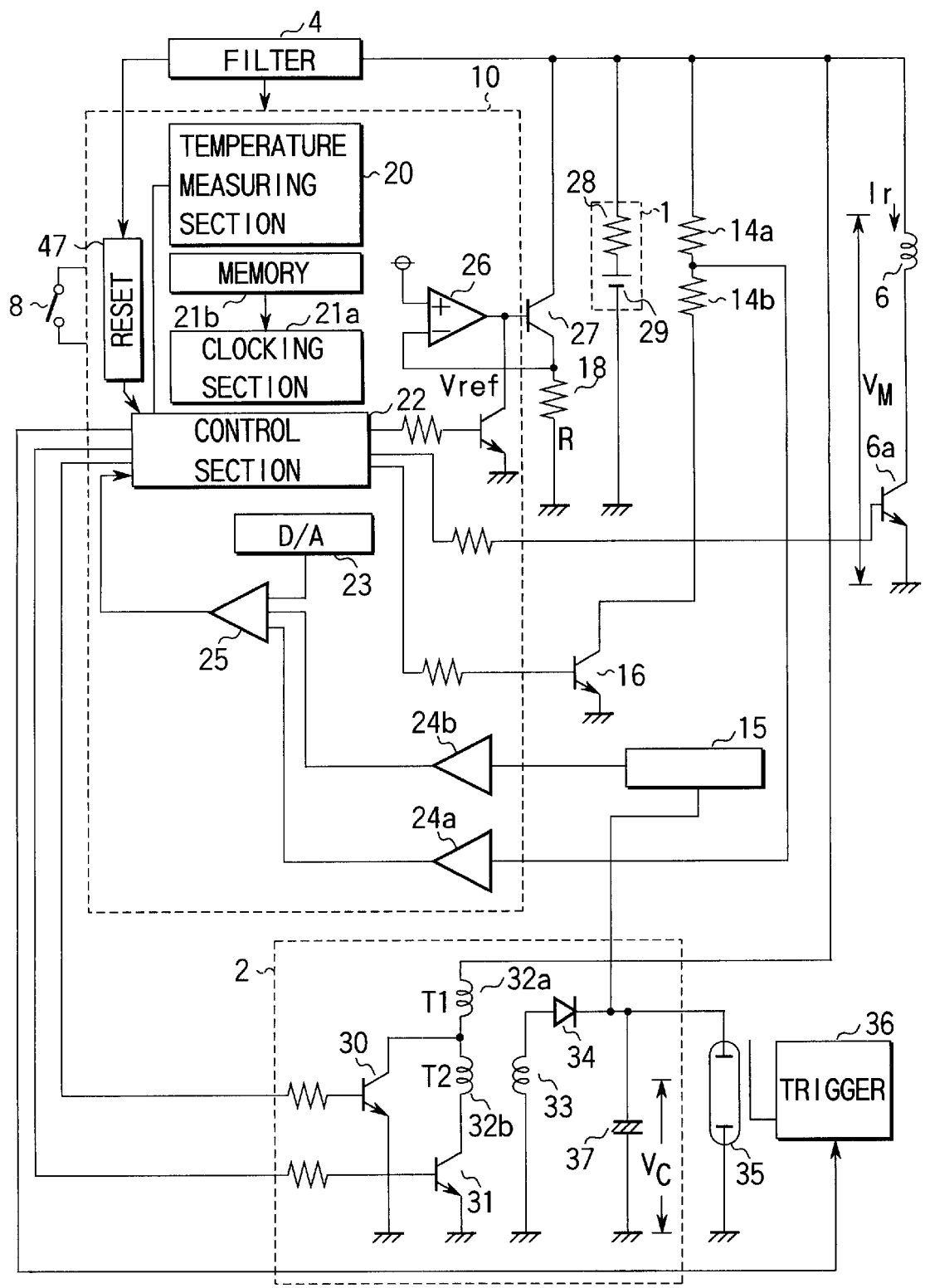
FIG. 8 is a diagram showing the battery-driven apparatus according to the second embodiment.

FIG. 8 is a diagram showing the configuration of battery-driven apparatus according to the second embodiment.

Compared to the first embodiment, the second embodiment further embodies a peripheral configuration of the mechatronic section 6 including a stroboscope section and an actuator.

In FIG. 8, reference numeral 6 denotes a plunger wherein a current therethrough is controlled and driven by turning on and off a transistor 6a. A resistance value and required current value Is of the plunger 6 are designed in advance.

In addition, the second embodiment differs from the above described first embodiment, which uses the transistor to provide the dummy current, in that the CPU 10 internally has a simple analog circuit and in that during a load current operation for the battery check, an amplifier 26, a transistor 27, and a resistor 18 serve to maintain this current at a constant value. Of course, this analog circuit can be externally disposed.

Compared to the first embodiment, which simply determines the current based on the resistance, the second embodiments is unlikely to be affected by the power supply or temperature and can apply a load more accurately. In addition, a buffer 24 inputs a partial battery voltage to a comparator (COMP) 25, and the CPU 10 switches an output from a D/A converter 23 while monitoring an output from the COMP 25 to determine the power supply voltage.

In addition, a control section 22 executes these operations pursuant to a program stored in a built-in ROM section (not shown) and uses a clocking function section 21 and a temperature-measuring function section 20 to control a release operation of the camera.

Figure 1B:
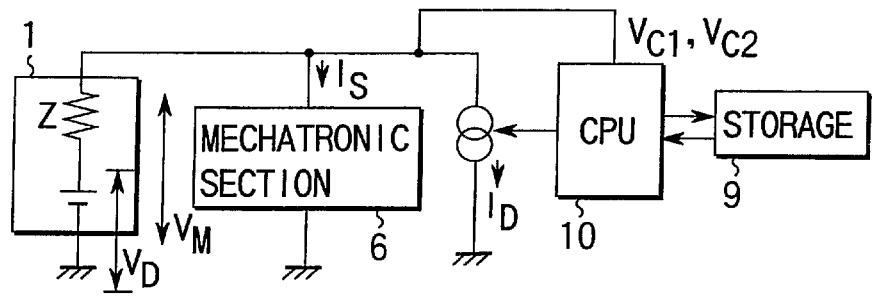
FIG. 1B is a simplified diagram of a battery-driven apparatus according to a second aspect of the present invention.

This configuration can be simplified into the one shown in FIG. 1B as a block diagram, and the relationship shown in this configuration allows Equation (13), shown below, to be derived.

If the voltage in the open state is defined as Vc1, the voltage in the loaded state is defined as Vc2, the internal resistance of the batteries 1 is defined as Z, the voltage applied to the mechatronic section 6 is defined as VM, and the dummy current is defined as ID, then the following equations hold:

$$Vc1 = V0 \tag{9}$$

$$Vc2 = V0 - ZID \tag{10}$$

$$VM = V0 - ZIs \tag{11}$$

$$Z = (Vc1 - Vc2)/ID \tag{12}$$

Thus, the voltage BM is expressed as follows:

$$VM = Vc1 - ((Vc1 - Vc2)/ID)Is \tag{13}$$

According to the second embodiment, Equation (13) is used to determine the battery voltages Vc1, Vc2 before and during the conduction of the dummy current ID, and the current Is required for camera operations and the voltage VM permitted after a voltage drop are used to check the battery voltage.

The charging section 2 oscillates a transistor 30 or 31 to provide a current and uses transformers 32a, 32b, 33 to supply an amplified current to a capacitor 37. In this case, a several-ampere current flows through the secondary side 33 of the transformer and acts as a heavy load on the batteries (not shown). When a high voltage, for example, 300 V is charged in the capacitor, a trigger circuit 36 applies a high voltage to ionize an inside of an Xenon (Xe) tube 35 for light emission.

With respect to this charging operation, voltage increase depends on the turn ratio; that is, a high turn ratio enables the voltage to increase substantially, whereas a low turn ratio results in a high efficiency and a faster charging but prevents charging up to a high voltage.

That is, the charging characteristic varies between charging of a primary coil of the transformer using only the T1 and charging thereof using T1+T2, which has a lager number of turns and a smaller turn ratio, as shown in FIGS. 9A and 9B. That is, with a sufficient battery voltage, the T1+T2 allows the coil to be charged faster up to 300 V, as shown in FIG. 9A.

In contrast, a reduced battery voltage or an increased internal resistance prevents the T1+T2 from charging the coil up to a predetermined voltage. In this case, the turn ratio must be switched based on the battery characteristics.

Thus, in the battery-driven apparatus according to the second embodiment, when the characteristics of the batteries 1 are detected to find that the voltage is low or the internal resistance Z has increased, the transistor to be oscillated is switched from 31 to 30 to enable appropriate stroboscope control depending on the conditions of the batteries 1. Of course, similar effects are obtained by switching the transistor 31 to the transistor 30 at the switching point shown in FIG. 9B.

Figure 10A:
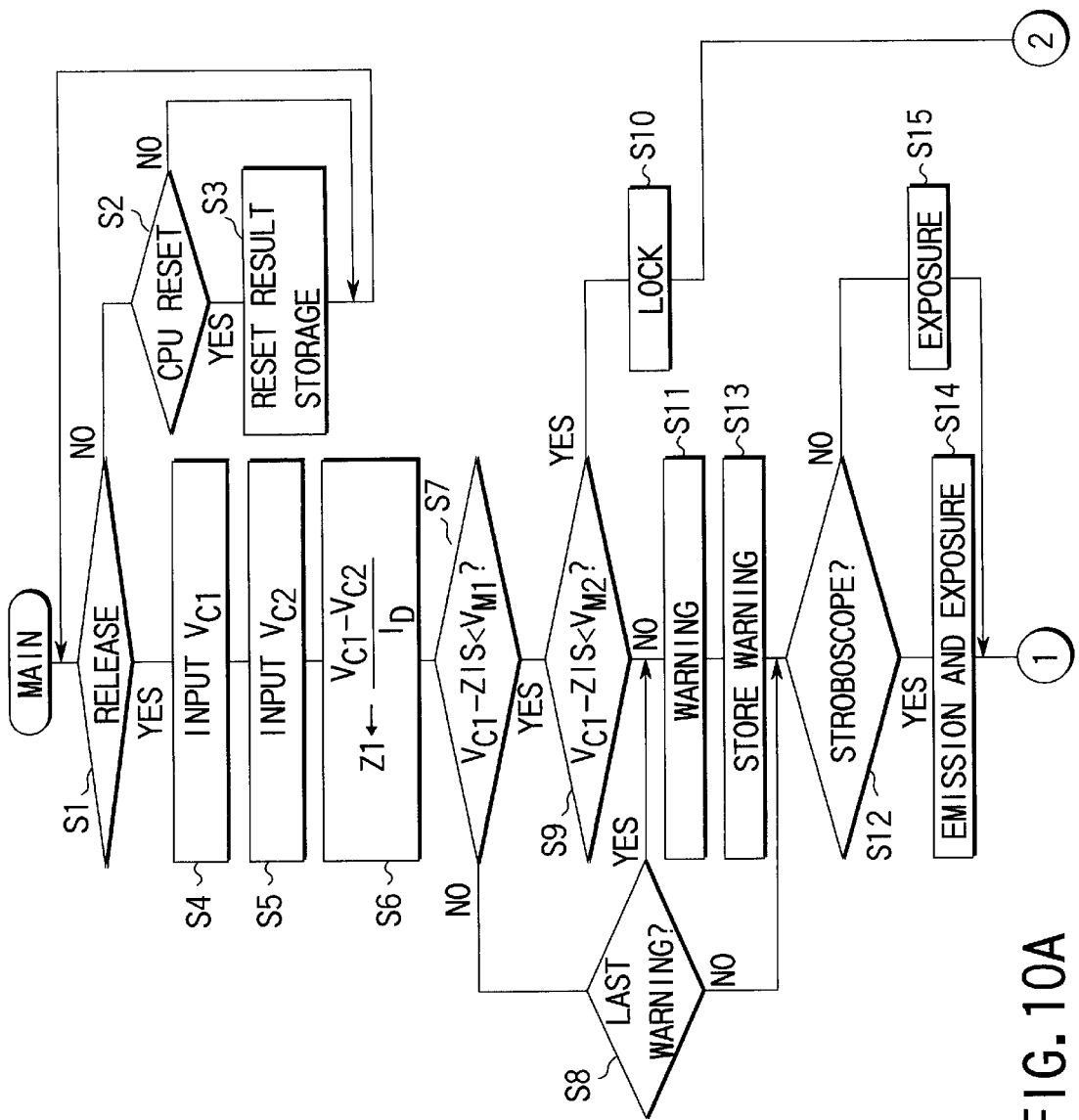
FIG. 10A is a flow chart useful in explaining in detail the operation of the battery-driven apparatus according to the second embodiment.
Figure 10B:
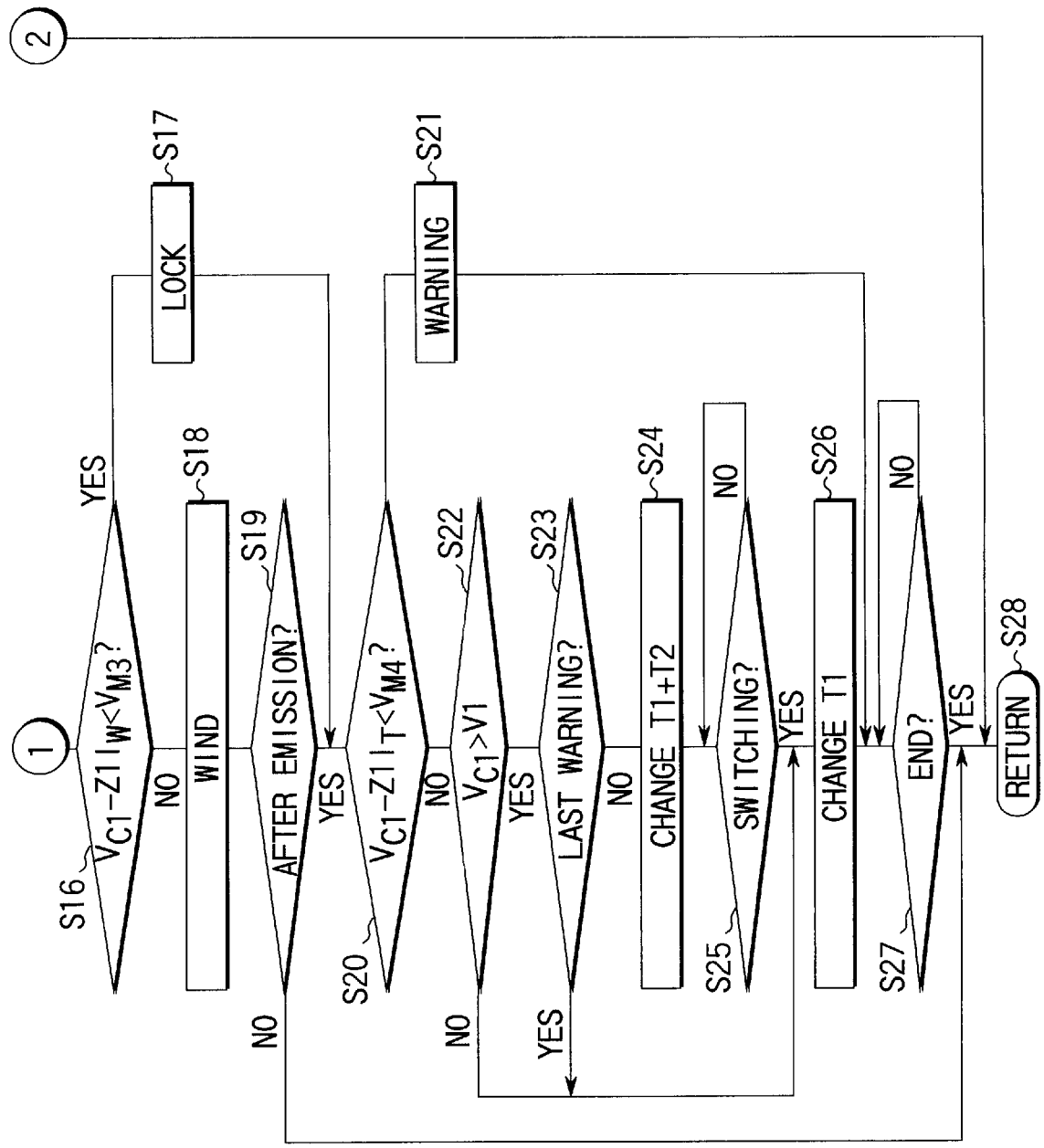
FIG. 10B is a flow chart useful in explaining in detail the operation of the battery-driven apparatus according to the second embodiment.

The operation of the battery-driven apparatus according to the second embodiment will be explained in detail with reference to the flow chart in FIGS. 10A and 10B.

First, the CPU 10 determines whether the user has operated a release switch (a step S1), and if not, it determines whether or not the user is to replace the batteries with new ones (a step S2). In this case, when the power supply voltage at the CPU 10 decreases below its operating voltage, a reset circuit 47 outputs a reset signal; this signal is used for the above determination. The reset circuit 47 comprises a simple analog circuit such as a comparator for determining whether or not the voltage has decreased.

When the batteries are to be replaced with new ones, a reset signal output state is switched to a no-reset-signal-output state to allow the CPU 10 to determine that replacement is to be carried out. Since batteries different from those associated with the last warning result are used, the last result is cleared (a step S3).

When the release switch is operated to start a release sequence operation, the battery voltage Vc1 obtained before the conduction of the dummy current and the battery voltage Vc2 during the conduction are determined (steps S4, S5) to determine an internal resistance Z1 of the batteries (a step S6). Subsequently, the internal resistance Z1, the Vc1, and the current Is required for a shutter actuator (the plunger corresponding to reference numeral 6 in FIG. 8) are used to determine whether or not the battery voltage is sufficient (steps S7, S9).

Reference VM2 denotes a voltage required for a plunger operation, and when it is determined at the step S9 that this requirement is not met, shutter operations are prohibited to prevent malfunction (a step S10). In this case, the display section preferably provides an appropriate display to allow the user to know that this prohibition does not result from a failure in the camera.

Specifically, the display is provided to make the user understand the situation easily.

Although an English display is employed as shown in FIGS. 6A to 6C, of course the display preferably may be switched to a Chinese version, a Japanese version, a German version, an Arabian version, a Swahili version, or the like depending on the user. To achieve this, the display section may comprise a dot display LCD so that the contents of a memory (not shown) that stores display contents can be switched depending on the sales territory.

The present technique enables the user to check the batteries for exhaustion irrespective of the battery type or temperature, thereby providing a camera that satisfies the user better.

On the other hand, reference VM1 denotes a voltage level provided to warn for battery replacement before the battery voltage decreases to the extent that the camera cannot operate. This warning allows the user to know that the battery must be replaced with new ones, to buy replacement batteries. Thus, it is not preferable that the camera is disabled immediately after the warning.

Accordingly, referencing the last determination result for a careful warning determination, which is characteristic of the present invention, is important. This is because if a recovery effect of the batteries has only instantaneously recovered the battery voltage, the battery level may decrease immediately to enter the above described locked state to preclude the camera operations despite the lack of the warning, whereby the user misses perfect moments for good photographs.

In addition, when the warning is issued, the issuance is stored in the memory (a step S13) so as to be referenced during the next battery check.

If it is determined at steps S7, S9 that the battery level is equal to or higher than the above described lock level, it is then determined whether or not stroboscope emission is required (a step S12), and the process enters a shutter sequence. A silver salt camera generally requires the film to be wound after photographing; the process thus enters a mechanical winding operation.

Thus, after the shutter operation at steps S14, S15, it is determined at a step S16 whether or not a winding mechanism operates correctly, as in the checking at the step S9. The process then shifts to the winding operation at the step S18.

The winding operation uses a current and a voltage different from those for the previous operations, so that corresponding numerical values for calculations are defined as Iw and VM3 before determinations. Careful determinations are made for each operation to allow the efficient use of the batteries. In addition, the stroboscope emission requires the capacitor to be charged; the current value observed during this charging may become several times as high as that for the actuator and the internal resistance measured during this charging may be different from that determined based on the ID at the step S6.

As shown in FIG. 11, the internal resistance of the batteries depends on current. Accordingly, when the current ID provided during checking differs substantially from that provided during operation, a relationship such as that shown in FIG. 11 is input to the CPU 10 beforehand as a table so that the Z1 determined at the above described step S6 is converted into a ZT obtained during operation (in this case, during charging) so that these values can be used to make determinations for a voltage drop at a step S20.

Reference VM4 denotes a battery voltage with which the CPU 10 or a stroboscope-related circuit may malfunction. When a current IT cannot be provided, the process branches to a step S21 to prohibit the camera operations or issue the warning to allow the user to know the situation. Since a current several times as high as that required for actuator operations flows during stroboscope charging, the warning at the step S21 may be excessively strict. Thus, a warning storage operation such as one after the step S11 is omitted.

In addition, the battery voltage is compared with a predetermined amount V1 to control the coil of the transformer as described above with reference to FIGS. 10A and 10B in order to select optimal charging control for the batteries (steps S22 to S26). A determination at the step S22 may be incorrect due to the recovery effect of the batteries. It is then determined whether or not the warning was issued during the last battery check (the step S23). Since the batteries for which the warning has been issued may have their battery voltage decrease immediately after the start of charging, an F1 is used for charging (the step S26). Then, when an end indication is provided (a step S27), all the operations are completed (a step S28).

As described above, the second embodiment performs the above described series of operations to conduct the battery check depending on the battery type or consumption, thereby precluding inefficient use of the batteries resulting from the display for battery replacement or disabling of the camera despite energy remaining in the batteries.

In addition, since the last battery check result can be referenced to provide a correct warning regardless of the recovery effect of the batteries, the user can replace the batteries before the camera becomes inoperative.

Next, a third embodiment of the present invention will be explained.

FIG. 12 is a conceptual diagram showing the configuration of battery-driven apparatus according to the third embodiment.

Since the battery characteristics vary sharply with temperature, the third embodiment is adapted to carry out the correct warning without depending on temperature.

As shown in FIG. 12, the microcomputer-based CPU 10 has a storage section 10a such as a RAM to store warning determination results. One bit of the memory may be used as a flag such that a value of "1" indicates that the warning has been issued and a value of "0" indicates that no warning has been issued. Temperature measurement results obtained by the temperature measuring section 20 are also stored in the storage section 10a. The display section 5 is controlled depending on the results stored in this manner.

Figure 13A:
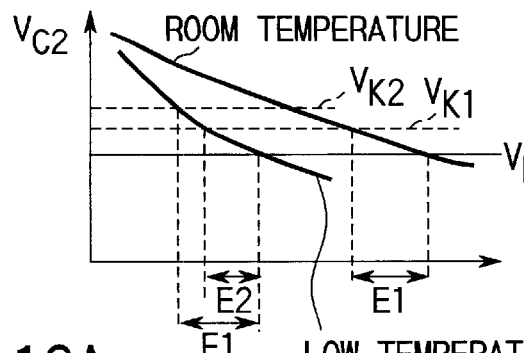
FIG. 13A is a chart showing a discharge characteristic of batteries.

FIG. 13A is a chart showing a discharge characteristic of the batteries.

In this figure, the axis of abscissa indicates a discharge time, while the axis of ordinate indicates the battery voltage Vc2 in the dummy load state, shown above in FIG. 2. This figure shows examples for room temperature and low temperature; the batteries have their performance rapidly degraded particularly at 0° C. or lower. This is noticeable in that at such a temperature, voltage drops more sharply even with the same battery energy consumption.

Thus, when a minimum operating voltage of the camera is fixed and a lock voltage VL is fixed and if the warning is issued at the same Vk1 both at room temperature and at low temperature, then at room temperature, there remains a margin E1 before the locked state as shown in the chart, whereas at low temperature, there remains only a margin E2 as shown in the chart (E1>>E2).

That is, even if the camera is adapted at room temperature so that a number of photographs can still be taken after the warning for battery replacement, then at low temperature, the lock state is entered before battery replacement. There will be no problem if the user can buy new batteries immediately after the issuance of the warning, but the user must give up photographing if, for example, the user is in the middle of a ski slope and is suddenly prevented from photographing.

Thus, the third embodiment provides the warning display earlier at low temperature so that the number of shots that can be taken before the batteries must be replaced is close to that at room temperature.

Specifically, at room temperature, energy E2 can be obtained between a warning level Vk1 and the lock level VL as shown in FIG. 13A. Accordingly, the warning level is increased to Vk2 so that the energy E1 can be consumed even at low temperature based on the battery characteristics.

Figure 13B:
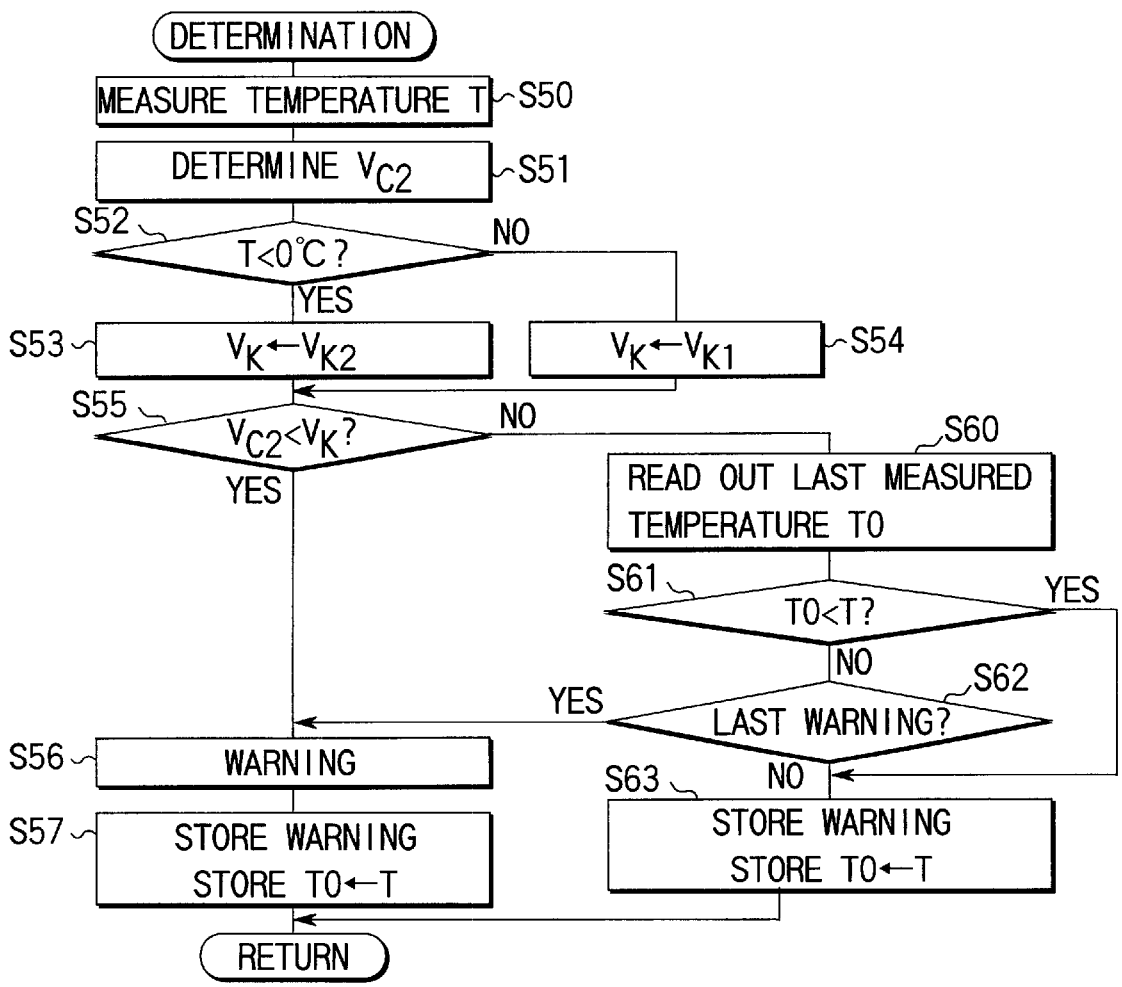
FIG. 13B is a flow chart showing a sequence of a warning determination during a battery check.

To enable such a switching operation, the CPU 10 makes a warning determination during a battery check using a sequence such as that shown in FIG. 13B.

First, the temperature measuring section 20 measures the temperature (a step S50), and a battery check section 19 measures the Vc2 shown above in FIG. 2 (a step S51). The detailed configurations of these circuits are as described in the above embodiment.

Subsequently, the warning level Vk is switched in accordance with the above temperature measurement result (steps S52 to S54). That is, the Vk is switched to the Vk2 if the temperature is lower than 0° C.; while it is switched to the Vk1 if the temperature is higher than 0° C.

Subsequently, the Vk is compared with the Vc2 to determine whether or not the warning is to be provided on the display section 5 (a step S55). The warning may be issued even if the energy is determined to be equal to or higher than the warning level, followed by branching to a step S60. This is due to a step that is characteristic of the present invention and that references the preceding battery check result before the battery check at the step S51. Further, the associated referencing of the temperature measurement result is characteristic of this embodiment.

Then, the temperature measurement result T0 obtained during the battery check is read out from the memory 10a and compared with the current temperature T measured at the steps 61 and 50. As a result, when the T0 is lower, it is determined that the last determination result was obtained under stricter conditions, and the process branches to a step S63 so as not to issue the warning.

In a cold embodiment, even a low energy consumption causes a voltage drop as shown in FIG. 13A, so that the warning is likely to be issued. Thus, when the last determination was made at low temperature and the camera is currently operated at room temperature, the battery characteristics are likely to have improved and the last determination result is unreliable.

When, however, the last temperature measurement result T0 is similar to the current T, the last warning is referenced at the step S62. If the last warning was issued for the batteries 1, it is then determined that the batteries 1 are actually exhausted but appears to be recovered upon the battery check, and the process branches to a step S56 to display the warning. If the warning is issued, the issuance and the then temperature are stored (a step S57).

As described above, the third embodiment makes warning determinations taking the battery temperature characteristic into account to enable correct battery checks without being affected by the battery recovery characteristic that the voltage increases instantaneously because the issuance of the warning suddenly disables the camera or because the batteries, which are expendable supplies, have not been operated for a long time.

As described above, the present invention can provide battery-driven apparatus that checks the batteries taking even the battery recovery characteristic into consideration to urge the user to replace the batteries with new ones at an appropriate time, thereby avoiding the worst situation where the user misses perfect moments for good photographs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. Electronic apparatus using at least one battery as a drive source, the apparatus comprising:
   a display section for showing a condition of the at least one battery;
   a determination circuit for detecting an internal resistance value of the at least one battery and for determining a present condition of the at least one battery based on the internal resistance value detected;
   a memory for storing a condition of the at least one battery determined by the determination circuit;
   a decision circuit for deciding that the at least one battery is exhausted if the electronic apparatus is incapable of operating normally based on both a present condition of the at least one battery determined from said determination circuit and a past condition of the at least one battery determined and stored in the memory; and
   a control circuit for controlling the contents of the display on said display section based on a decision made by the decision circuit.

2. Electronic apparatus according to claim 1, wherein the display on said display section includes a warning display urging battery replacement.

3. Electronic apparatus according to claim 2, wherein even if the decision circuit decides that at least one battery is not exhausted, said control circuit provides the warning display on said display section if the decision circuit decides that said at least one battery is exhausted.

4. Electronic apparatus according to claim 1, further comprising a memory in which a current consumption value and a required voltage of an individual camera are stored during manufacture, wherein:
   said determination circuit determines the present condition of the at least one battery based on said internal resistance value, said current consumption value, and said required voltage.

5. Electronic apparatus according to claim 1 further comprising a memory in which a current value and a voltage value required for camera operations are stored during manufacture, wherein:
   said determination circuit determines the present condition of the at least one battery based on said internal resistance value, said current value, and said voltage value.

6. Electronic apparatus according to claim 1, further comprising a detection circuit for detecting that the at least one battery has been replaced with new ones, wherein:

said control circuit clears the past condition of the at least on battery determined and stored in said memory based on an output signal from said detection circuit if the detector circuit detects that the at least one battery has been replaced.

7. Electronic apparatus according to claim 1, wherein said electric apparatus is a camera.

8. The apparatus of claim 1 further comprising a mechatronic component, wherein a condition of the at least one battery is selected from a group of conditions consisting of (a) exhausted, and (b) not exhausted, and wherein a condition of the at least one battery is considered exhausted if it does not have sufficient capacity to power the mechatronic component.

9. The apparatus of claim 1 wherein the at least one battery exhibits a voltage recovery characteristic, and wherein the determination circuit compensates for the voltage recovery characteristic of the at least one battery.

10. Electronic apparatus using at least one battery as a drive source, the apparatus comprising:

a display section for showing a condition of the at least one battery;

a first memory that stores a current value and a voltage value required for camera operations;

a determination circuit for detecting an internal resistance value of said at least one battery and for determining a present condition of the at least one battery based on the internal resistance value detected and the current and voltage values stored in said first memory;

a decision circuit for deciding that the at least one battery is exhausted if the electronic apparatus is incapable of operating normally based on a present condition of the at least one battery determined by the determination circuit; and a control circuit for controlling the contents of the display on said display section based on an output from the decision circuit.

11. Electric apparatus according to claim 10, further comprising a second memory that stores the a present condition of the at least one battery determined by said determination circuit, wherein:

said display control circuit controls the contents of the display on said display section based on a present condition of the at least one battery determined from said determination circuit and on a past condition of the at least one battery determined and stored in said second memory.

12. Electric apparatus according to claim 10, wherein said first memory has the current and voltage values required for the camera operations stored therein during manufacture as values specific to the camera unit.

13. Electric apparatus according to claim 10, further comprising a third memory storing data of a dependence of the internal resistance value of said at least one battery on current, wherein:

said determination circuit determines the condition of the at least one battery based on the data stored in said third memory.

14. Electric apparatus according to claim 13, wherein said data of the dependence of said at least one battery on current is used to correct an error in the detected internal resistance value arising from a difference between the current value required for the camera operations and a dummy current value used in detecting said internal resistance.

15. Electronic apparatus according to claim 10, wherein said electric apparatus is a camera.

16. The apparatus of claim 10 further comprising a mechatronic component, wherein a condition of the at least one battery is selected from a group of conditions consisting of (a) exhausted, and (b) not exhausted, and wherein a condition of the at least one battery is considered exhausted if it does not have sufficient capacity to power the mechatronic component.

17. The apparatus of claim 10 wherein the at least one battery exhibits a voltage recovery characteristic, and wherein the determination circuit compensates for the voltage recovery characteristic of the at least one battery.

18. Electronic apparatus using at least one battery as a drive source, the apparatus comprising:

decision means for deciding a timing used to determine a state of the at least one battery;

determination means for using the timing decided by the decision means, to determine a voltage of the at least one battery;

temperature measuring means for measuring a temperature of said at least one battery or a periphery thereof;

storage means for storing a result of the determination made by said determination means and a temperature measurement result from said temperature measuring means;

display means for showing a condition of the at least one battery;

a decision means for deciding that the at least one battery is exhausted if the electronic apparatus is incapable of operating normally based on the information stored in said storage means; and display control means for deciding the contents of a display on the display means to control said display means based on an output from the decision means.

19. Electric apparatus according to claim 18, wherein said decision means decides whether the at least one battery is exhausted based on the information stored in said storage means and on a current temperature measurement result from the temperature measuring section.

20. Electronic apparatus according to claim 18, wherein said electric apparatus is a camera.

21. The apparatus of claim 12 wherein the at least one battery exhibits a voltage recovery characteristic, and wherein the determination circuit compensates for the voltage recovery characteristic of the at least one battery.

* * * * *